United States Patent [19]

Sato et al.

[11] Patent Number: 4,498,106
[45] Date of Patent: Feb. 5, 1985

[54] PULSE GENERATOR FOR SOLID-STATE TELEVISION CAMERA

[75] Inventors: Kazuhiro Sato, Tokyo; Morishi Izumita, Inagi; Kenji Takahashi; Toshiyuki Akiyama, both of Kodaira; Shigeki Nishizawa, Mobara, all of Japan

[73] Assignee: Hitachi, Ltd., Tokyo, Japan

[21] Appl. No.: 402,420

[22] Filed: Jul. 28, 1982

[30] Foreign Application Priority Data

Jul. 29, 1981 [JP] Japan .................................. 56-117777

[51] Int. Cl.³ ............................................. H04N 3/12
[52] U.S. Cl. ....................... 358/213; 358/212, 358/150
[58] Field of Search ................... 358/213, 212, 150, 44

[56] References Cited

U.S. PATENT DOCUMENTS 3,422,223 1/1969 Scipione ............................. 358/150
4,079,423 3/1978 Diehl .................................. 358/213
4,080,622 3/1978 Sugihara .............................. 358/44
4,278,999 7/1981 Ganguly et al. ..................... 358/213

Primary Examiner—Gene Z. Rubinson
Assistant Examiner—Robert Lev
Attorney, Agent, or Firm—Antonelli, Terry & Wands

[57] ABSTRACT

A pulse generator circuit for a solid-state television camera comprising a first circuit arrangement including a shift register of endless type for obtaining pulses of a horizontal scanning frequency for television, a second circuit arrangement for obtaining necessary pulse trains of the horizontal scanning frequency for a television camera from a plurality of output pulses of the shift register and a third circuit arrangement for dividing the pulse obtained by the second circuit arrangement by two-different factors of mode, n and n+1, and delaying the 1/n frequency-divided mode pulse by ½ horizontal scanning period in response to the output pulse from the second circuit arrangement thereby obtaining a frame pulse capable of interlaced scanning.

5 Claims, 8 Drawing Figures

PULSE GENERATOR FOR SOLID-STATE TELEVISION CAMERA

This invention relates to a pulse generator for a television camera, and more particularly to a driving pulse generator for a television camera using a solid-state image sensor.

The solid-state image sensor, for example, MOS-type solid-state image sensor is arranged so that signals from photodiodes arranged in a matrix array as a light-sensitive portion are read in a time-series by switching on and off the signal-reading MOS switches arranged in vertical and horizontal directions.

The accompanying drawings will be given, in which.

Figure 1:
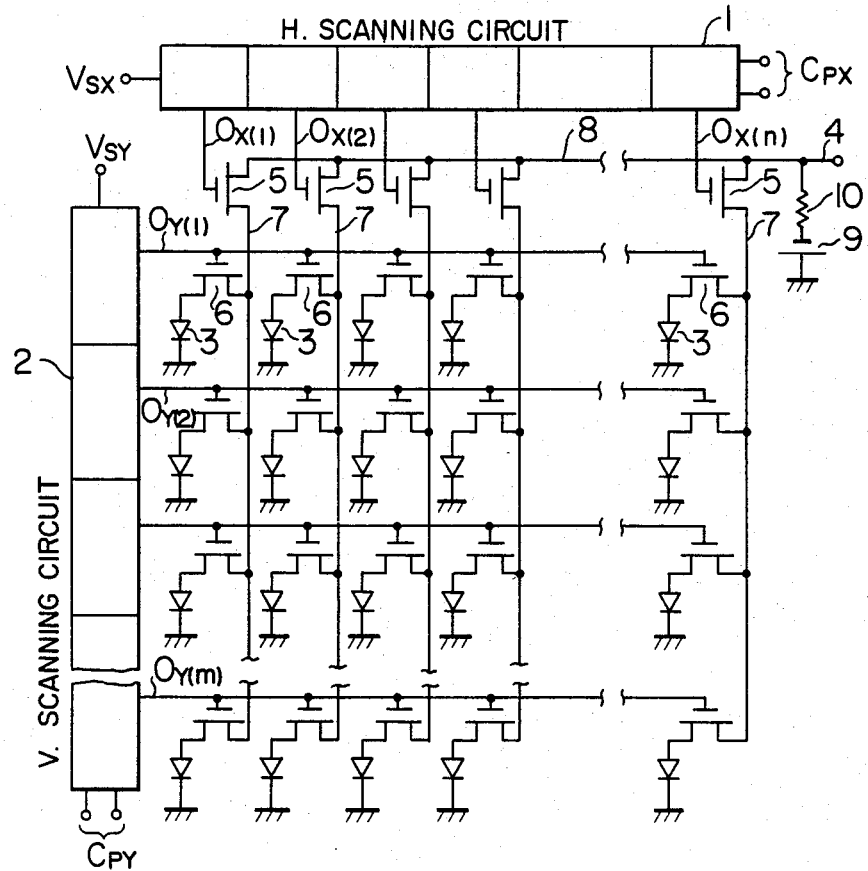
FIG. 1 shows one example of structure of a MOS-type solid-state image sensor.
Figure 2:
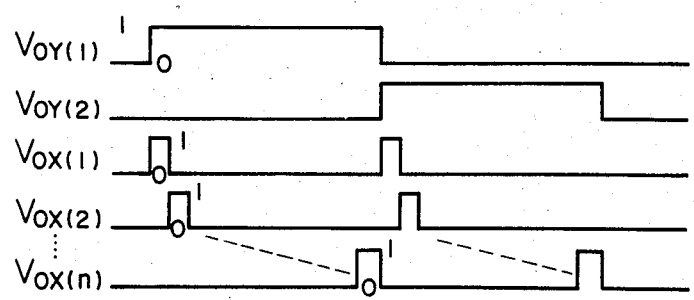
FIG. 2 is a waveform diagram of vertical and horizontal scanning pulses for driving the solid-state image sensor.

The principle of a MOS-type solid-state image sensor will be described with reference to FIG. 1 which shows one example of the basic structure of the MOS-type solid-state image sensor, and FIG. 2 showing one example of the timing chart of horizontal and vertical scanning pulses.

Referring to FIG. 1, there are shown horizontal and vertical scanning circuits 1 and 2, photodiodes 3 arranged in a two-dimensional matrix array on an image picking-up surface, vertical signal reading lines 7 each provided at the respective columns of the matrix, vertical signal reading switches 6 each provided between the photodiode 3 and signal reading line 7, horizontal signal reading switches 5 each provided between the vertical signal reading line 7 and an output line 8, a video signal output terminal 4, a load resistor 10, and a video bias power supply 9.

The horizontal scanning circuit 1 consists of a shift register arranged so that a horizontal input pulse $V_{sx}$ supplied at each horizontal scanning period is shifted in turn by the application of, for example, two-phase clocks $C_{px}$ ($C_{px1}$ and $C_{px2}$) to produce output pulses at the respective-stage output lines $O_x(1)$ to $O_x(n)$. Similarly, the vertical scanning circuit 2 consists of a shift register arranged so that a vertical input pulse $V_{sy}$ supplied at each frame is shifted in turn by the application of two-phase clocks $C_{py}$ ($C_{py1}$ and $C_{py2}$) to produce pulse outputs at output lines $O_y(1)$ to $O_y(m)$.

One example of waveforms of the pulses $V_{ox}(1)$ to $V_{ox}(n)$, and $V_{oy}(1)$, $V_{oy}(2)$ ... produced from the horizontal and vertical scanning circuits are shown in FIG. 2. The reading switches 5 and 6 are controlled to turn on and off in turn by the pulse trains $V_{ox}(1), \ldots, V_{oy}(1)$, ..., permitting the signals from the matrix-arrayed photodiodes 3 to be supplied in order through the reading lines 7 and the output line 8 to the video signal output terminal 4. These scanning circuits 1 and 2 may be a shift register capable of being operated by three-phase or four-phase clock pulses. Also, a color camera can be formed by combining the solid-state image sensor with color filters.

As described above, operation of the solid-state image sensor requires a plurality of clock pulses in a predetermined frequency and phase relationship. In order to convert the output signals from the solid-state image sensor to a television signal, a blanking signal, horizontal and vertical synchronizing signals and so on are also required other than the clock pulses mentioned above.

A conventional solid-state color television camera of, for example, NTSC standard includes an oscillator circuit for generating a high-frequency reference signal of 14.31818 MHz, which is processed by a frequency divider circuit, a counter circuit, and a decoder circuit so as to produce various pulses set forth above.

A circuit arrangement of the television camera of NTSC type will be described hereunder.

Figure 3:
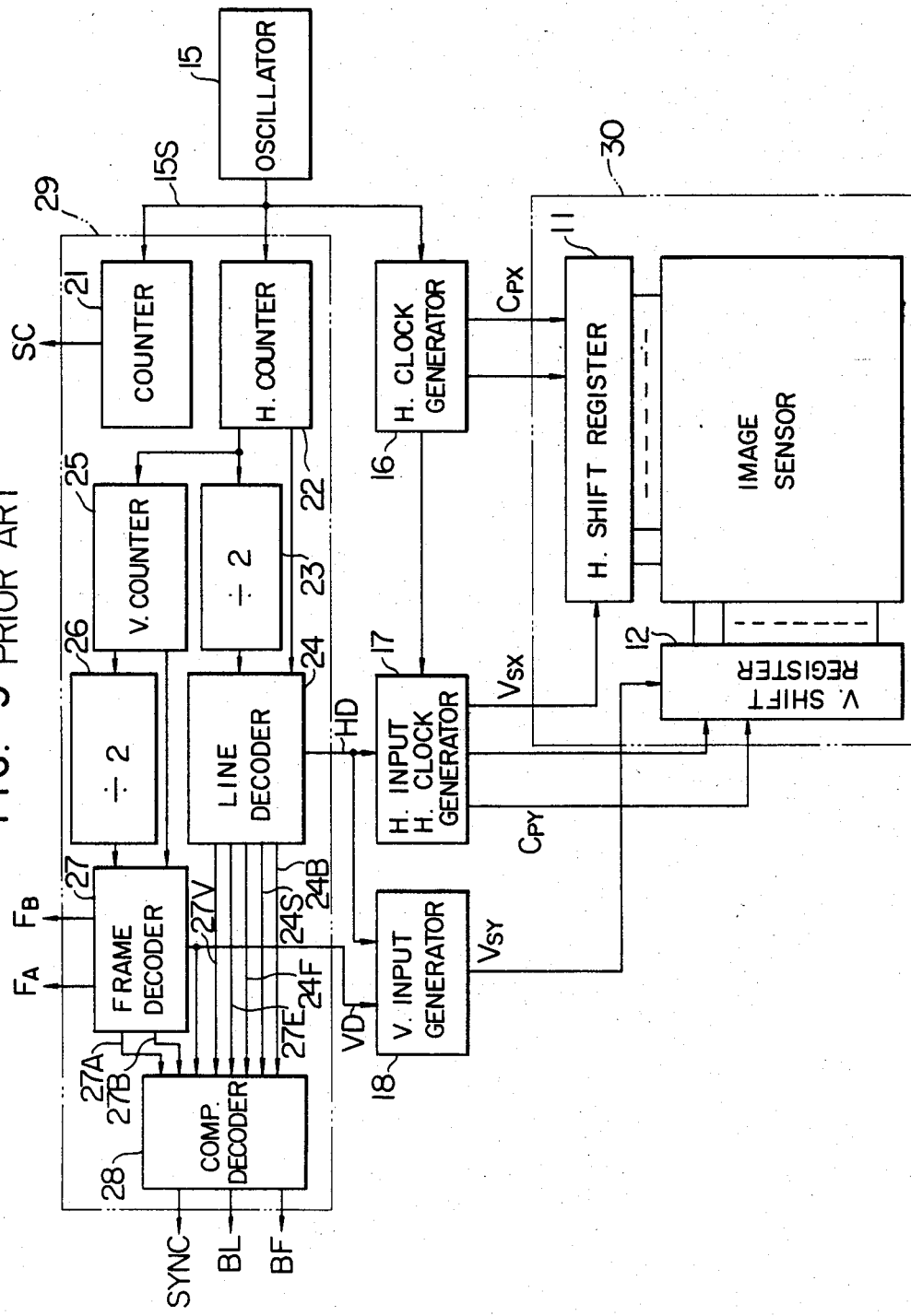
FIG. 3 is a block diagram of a conventional driving pulse generator.
Figure 4:
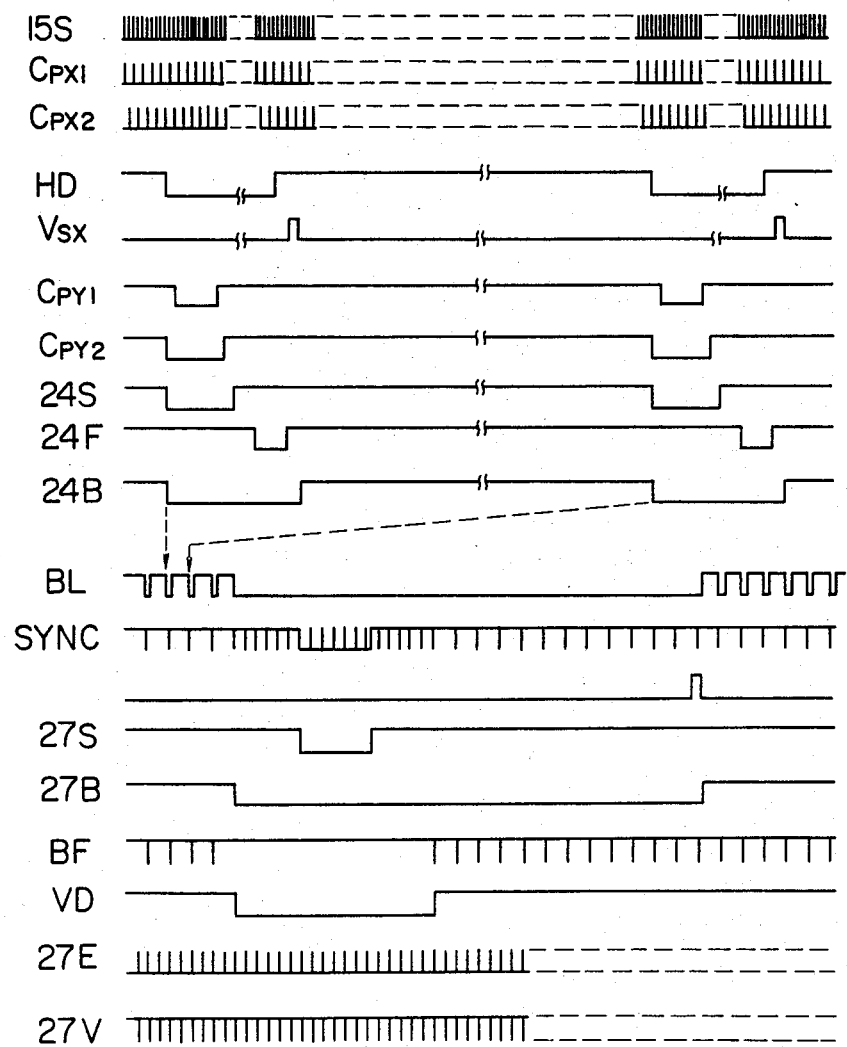
FIG. 4 is a waveform diagram of signals produced from the pulse generator of FIG. 3.

FIG. 3 shows an arrangement of a conventional pulse generator circuit, and FIG. 4 shows waveforms at respective portions thereof.

Referring to FIG. 3, there are shown a high-frequency oscillator circuit 15 of, for example, 14.31818 MHz, a horizontal clock $C_{px}$ generating portion 16, a horizontal input pulse $V_{sx}$ and vertical clock pulse $C_{py}$ generating portion 17, a vertical input pulse $V_{sy}$ generating portion 18, a counter portion 21 for forming a subcarrier from the frequency of 14.31818 MHz, a horizontal counter portion 22 for making a frequency of 31.5 kHz (twice the horizontal scanning frequency) from the 14.31818 MHz, a circuit 23 for making a horizontal scanning frequency of 15.734 kHz by dividing by two the frequency of the output of the counter portion 22, a line decoder circuit 24 for making a horizontal drive pulse (HD) and so on, a vertical counter portion 25 for making the vertical scanning frequency from 31.5 kHz, a circuit 26 for dividing by two the frequency of the output of the vertical counter portion 25, a frame decoder circuit 27 for making a vertical drive pulse (VD) and so on, and a composite decoder circuit 28 for making a composite synchronizing pulse and so on.

The circuits 21 to 28 are a common arrangement as a synchronizing signal generator for a television camera, and already formed as an LSI now available (for example, the model 3262A made by Fairchaild Co., Ltd.)

Here, this LSI is generally represented by numeral 29, and the solid-state image sensor including the scanning circuits generally by numeral 30.

The horizontal clock generating portion 16 is a circuit for making the driving pulse to the horizontal shift register 11, that is it divides the frequency of an output pulse 15S from the oscillator 15 to produce a frequency depending on the number of picture elements of the image sensor and, in combination with a phase-shifting circuit, generates two phase clock pulses $C_{px1}$ and $C_{px2}$.

The circuit 17 produces a horizontal input $V_{sx}$ and vertical clock pulses $C_{py}$, basing on an HD pulse of the synchronizing signal generating LSI29 and the horizontal clock pulse $C_{px}$. The circuit 18 generates the vertical input pulse $V_{sy}$, basing on the VD and HD signals. The horizontal and vertical input pulses $V_{sx}$ and $V_{sy}$ are supplied to the horizontal and vertical shift registers 11 and 12, respectively.

The synchronizing signal generator 29 produces a chrominance subcarrier, a composite synchronizing pulse (SYNC), a composite blanking pulse (BL), a burst flag pulse, an odd- and even-field discriminating pulse, HD and VD pulses and so on. The central portions for generating such signals comprise the horizontal counter portion 22, the line decoder 24, the vertical counter portion 25, the frame decoder 27 and the composition decoder 28.

In the NTSC-system synchronizing signal generator, the frequency of 14.31818 MHz is divided by 455 in the horizontal counter 22, to produce 31.5 kHz which is then divided further by 525 in the vertical counter portion 25 to produce the frame frequency of 59.9 Hz.

The counter circuit 23 serves to divide 31.5 kHz by 2 thereby producing the horizontal scanning frequency of 15.734 kHz. The counter circuit 26 serves to divide 59.9 Hz by 2 thereby producing an odd- and even-field discriminating pulse.

The decoder circuit 24 is supplied with the output pulses from the counter circuits 22 and 23 so as to produce a pulse 24F for the HD and burst flag, a horizontal synchronizing pulse 24S, a horizontal blanking pulse 24B and pulses 27E and 27V for equalizing pulses. The decoder circuit 27 is supplied with the output pulses from the counter circuits 25 and 26, to produce the VD pulse, the vertical synchronizing pulse 27S, the vertical blanking pulse 27B, and the field discriminating pulses $F_A$ and $F_B$.

The decoder circuit 28 is supplied with the output pulses from the circuits 24 and 27, to produce the composite synchronizing pulse (SYNC), composite blanking pulse (BL), burst flag (BF) and so on. The circuit 21 generates a subcarrier pulse (SC) of 3.579545 MHz, or it is a counter circuit for dividing 14.31818 MHz by 4.

Although in the solid-state television camera there has been a great problem that synchronous noises appear in the video output, the inventors have found that the synchronous noises are due to the pulse generating circuit including the counters, and decoders stated above.

In other words, when a pulse of a high frequency is generated by an oscillator circuit and then reduced to a predetermined frequency by a counter circuit, pulsative noise caused at each stage of the counter circuit is induced in the output line through the power line or the earth line or by electrostatic coupling, and in particular, the noise pulse in the horizontal shift register side causes vertical stripes on the picture screen.

It is an object of this invention to provide a pulse generator circuit of a novel arrangement for solid-state television camera, in which the synchronous noise is removed by using a shift register as the horizontal counter.

According to this invention, there is provided a pulse generator circuit in which a so-called ring counter consisting of a shift register with the input and output ends being connected together and a decoder circuit are used to generate all the pulses of horizontal scanning frequencies, the pulse of horizontal scanning frequency produced from the ring counter is divided in frequency by two separate factors of n and n+1 (n is a positive integer), and the resulting 1/n-frequency-divided mode pulse is delayed by ½ horizontal scanning period of time, thereby producing a frame pulse capable of interlacing.

An embodiment of this invention will hereinafter be described in detail with reference to the accompanying drawings.

Figure 5:
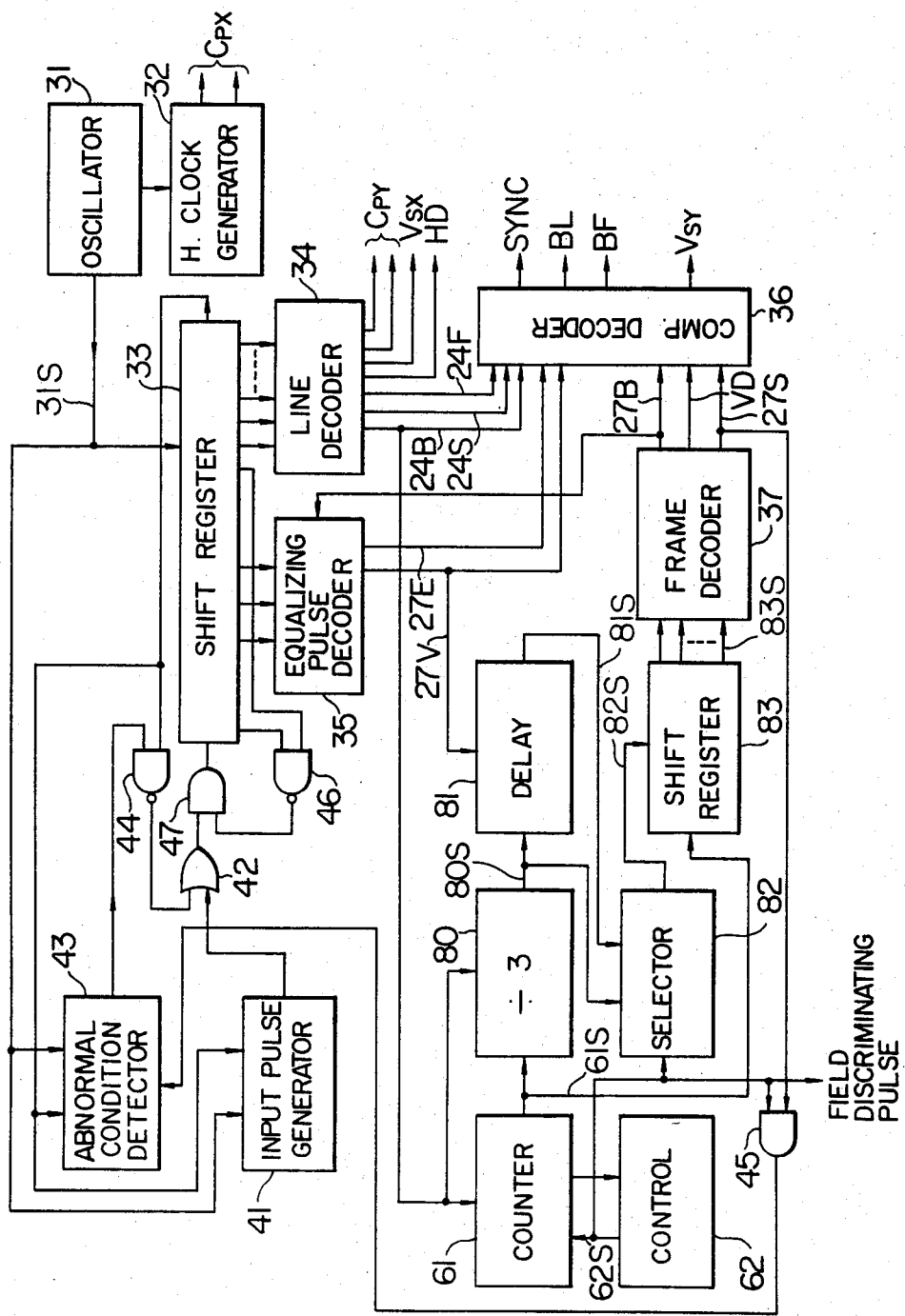
FIG. 5 is a block diagram of an embodiment of a driving pulse generator according to the present invention.

FIG. 5 is a block diagram of a main part of a pulse generator circuit according to this invention. A circuit 31 is an oscillator circuit for generating a high-frequency pulse and a circuit 32 produces the horizontal clock $C_{px}$ from the high-frequency pulse.

In the pulse generator circuit of this invention, a horizontal counter is not used but a ring counter circuit is used to generate the horizontal scanning frequency.

To constitute the ring counter circuit, a shift register 33 in FIG. 5 has its input and output ends connected together, thus forming a ring-like shift register, to which a pulse is supplied from an input pulse generator 41 through an OR gate 42 and which causes the input pulse to shift step by step therealong in response to the clock pulse applied thereto.

Since the ring counter continues to transfer the input pulse while the clock pulse is being supplied thereto, a frequency-dividing counter having a dividing factor corresponding to the number of stages of the shift register, can be formed by taking out the transferred pulse from one output end, that is, the clock frequency can be divided directly by n (n is the number of stages of the shift register).

In addition, since output pulses each with a phase shifted by one clock duration can be produced at the respective stages of the shift register 33, combining of pulses of necessary phases will provide all pulses required for the television camera. If, for example, clock pulse of 14.31818 MHz is used, a shift register of 910 stages is required (910/m-stages shift register is required for clock pulse of 14.31818 MHz/m) and at this time 910 different-phase pulses of 15.755 kHz can be generated.

Therefore, necessary pulses are taken out from a shift register for generating pulses of phases within the blanking period of a video signal, so as to produce various different pulses of HD, $V_{sx}$, $C_{py}$, $C_{py2}$, 24S, 24F, and 24B shown in FIG. 4 at a decoder circuit 34.

A circuit 35 is an equalizing pulse decoder circuit for making the equalizing pulses 27E and 27V within the vertical blanking period.

The equalizing pulse decoder circuit is controlled by the vertical blanking pulse 27B, to operate only during the blanking period.

In the pulse generator circuit of this invention, since a pulse for determining ½ horizontal scanning period is present only within the vertical blanking period, the vertical synchronizing pulse capable of interlaced scanning cannot be formed by the conventional method.

Thus, in this circuit of the invention, the horizontal scanning frequency is divided by two separate factors of n and n+1, and the resulting 1/n frequency-divided mode pulse is delayed by ½ horizontal scanning period of time, thereby to achieve the object.

A circuit 61 is a counter circuit for frequency-dividing the horizontal blanking pulse 24B produced by the line decoder. This counter circuit 61 takes first and second frequency-dividing modes and counts the input pulse in either mode specified by a control signal 62S (FIG. 6) produced from a control circuit 62 to produce an output pulse 61S shown in FIG. 6 every time the input pulse reaches a predetermined value.

The counter 61, when operated in the first frequency-dividing mode, produces the output pulse 61S at every 262 input pulses, and when operated in the second-frequency dividing mode, produces the output pulse at every 263 input pulses.

The control circuit 62 is, for example, a flip-flop supplied with the output pulse 61S from the counter 61 to invert its condition in response thereto. Thus, every time the pulse 61S is supplied from the counter 61, the control circuit 62 inverts its state, while the counter 61 is alternately switched over between the first and second frequency dividing modes.

A circuit 83 is a shift register with parallel outputs. In this embodiment, the output pulse 61S (shown in FIG. 6) is supplied from the counter 61 to the shift register 83, and the outputs therefrom are used in proper combination to make desired pulses.

Circuits 80, 81 and 82 produce clock pulses to be supplied to the shift register 83. The horizontal blanking pulse shown in FIG. 6 at 24B is divided in frequency by 3 at the frequency divider circuit 80 so that an output 80S is delayed by ½ horizontal scanning period of time at the delay circuit 81 to produce a pulse 81S.

The circuit 82 alternately selects the pulses 80S and 81S supplied through two different routes in response to the control signal 62S. The output pulse 82S therefrom is supplied to the shift register 83 so that an output pulse 83S of the shift register 83 is delayed by ½ horizontal scanning period of time every one field. Also, the pulse 62S is used as a field discriminating pulse. Various types of solid-state image sensor capable of interlaced scanning are publicly known, and an example thereof is described in detail in Japanese patent application No. 4895/79 filed previously by the same assignee of this application. This field discriminating pulse 62S is applied to the field switching pulse generator circuit of the image sensor.

The counter circuit 80 is reset by the synchronizing pulse 61S from the counter 61 every 262 and 263 horizontal scanning periods, so that both counters timely produce output pulses in synchronism with each other.

Figure 6:
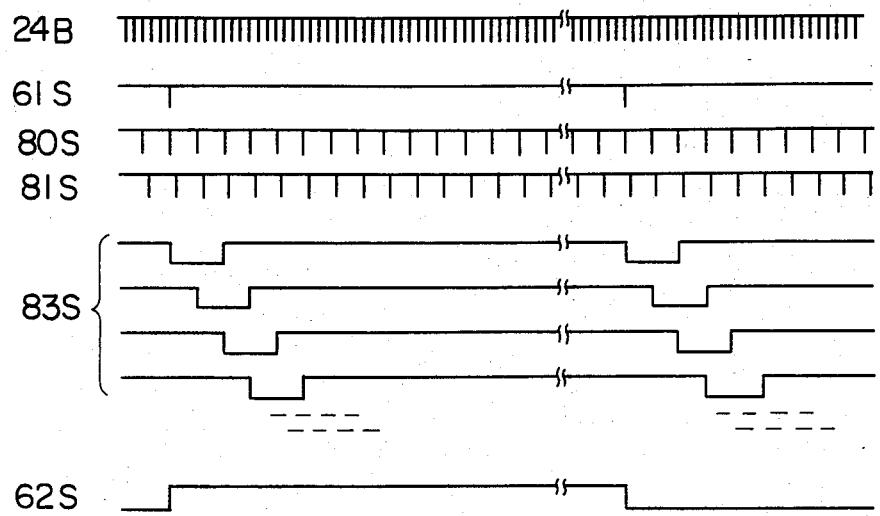
FIG. 6 is a waveform diagram for explaining the operation of a vertical synchronizing pulse generating circuit in the pulse generator of FIG. 5.

Pulse trains produced at the respective stages of the shift register 83 as shown in FIG. 6 at 83S are supplied to a frame decode circuit 37. Where combinations thereof are made to produce the VD pulse, the vertical blanking pulse 27B and the vertical synchronizing pulse 27S shown in FIG. 4. A composite decoder circuit 36 is supplied with the output pulses from the line decoder 34, the equalizing pulse decoder 35, and the flame decoder 37, so as to form a composite synchronizing pulse SYNC, a composite blanking pulse BL, a burst flag BF and a vertical input pulse $V_{sy}$.

The main part of the pulse generator circuit of this invention has been described. Another feature of this invention is in the provision of a malfunction preventing circuit comprising circuits 43, 44, 46 and 47 in FIG. 5.

The ring counter circuit set forth above cannot produce correct pulses when a plurality of pulses are continuously transferred or when pulses to be transferred are erased.

Thus, in the pulse circuit of this invention, the abnormal condition detector portion 43 is used to always monitor the pulse transfer condition of the ring counter. When two or more pulses occur during one horizontal scanning period, the detector 43 causes the gate circuit 44 to close, or when the contents of the ring counter are filled with pulses, it causes the gate circuit 47 to close, thereby erasing the transferred pulses within the shift register. Thereafter, one single input pulse is supplied from the input pulse generator portion 41 to the ring counter thereby causing it to be in the normal operation. Also, when the transferred pulses are erased the pulse is supplied similarly from the input pulse generator portion.

Figure 7:
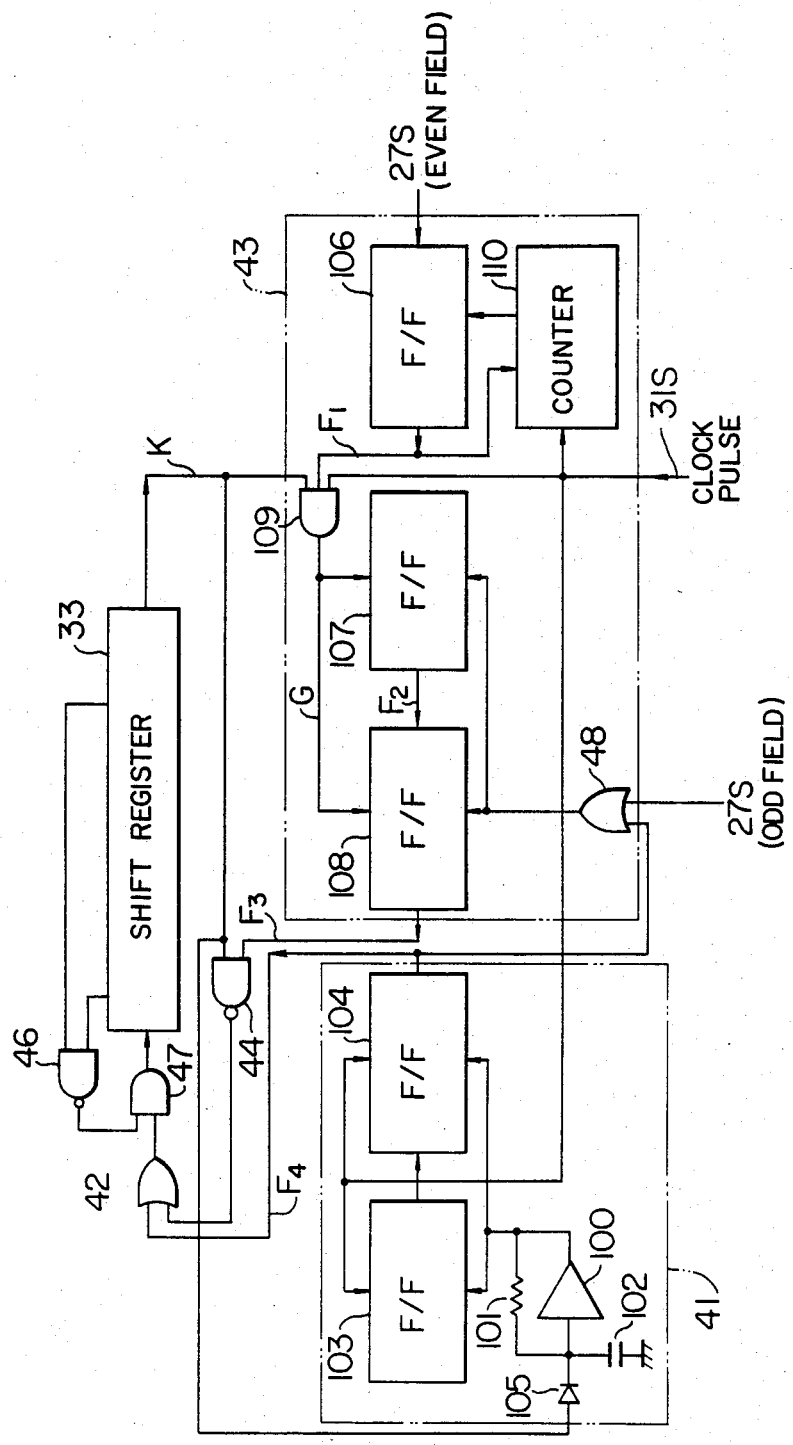
FIG. 7 is a block diagram of an example of a malfunction preventing circuit for a ring counter circuit.

FIG. 7 shows relationship among the input pulse generator portion 41, the abnormal condition detecting portion 43, the gate circuit 44, and the OR gate 42.

The input pulse generating portion 41 includes an oscillator circuit consisting of a pulse amplifier 100, a resistor 101 and a capacitor 102, and two flip-flop circuits 103 and 104 for producing a single pulse synchronized with the clock pulse 31S.

When a pulse is transferred into the shift register, the pulse is stored in the capacitor as a voltage thereacross through a diode 105, and thus the pulse amplifier has its input end kept at high level and its output end at low level whereby the oscillator stops oscillation. When no pulse is present in the shift register, charge in the capacitor 102 is gradually discharged through the resistor 101 and thus the voltage at the input end of the pulse amplifier 100 eventually reaches a predetermined value, at which time the voltage at the output end of the amplifier 100 is rapidly inverted to a high level. If the time constant for this inversion is determined by properly selecting the values of the resistor 101 and the capacitor 102 so as to be slightly longer than one horizontal scanning period, the input pulse generating portion 41 never generates any pulse as long as the ring counter has a pulse.

Figure 8:
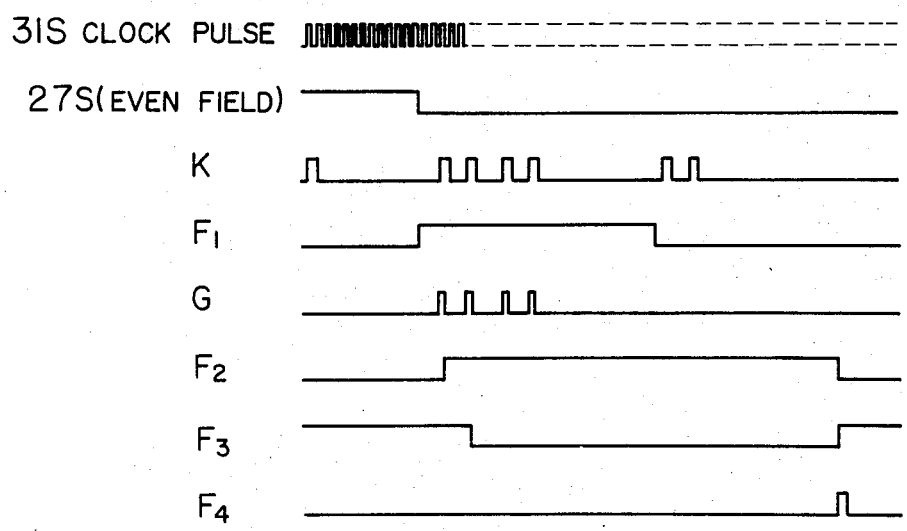
FIG. 8 is a waveform diagram for explaining the operation of the example of FIG. 7.

On the other hand, the malfunction preventing circuit comprises flip-flops 106, 107 and 108, gate circuits 44 and 109 and a counter circuit 110, and serves to prevent the shift register from having two or more pulses. The basic operation of the malfunction preventing circuit will be described with reference to the pulse waveforms as shown in FIG. 8.

The flip-flop 106, when supplied with the vertical synchronizing pulse 27S of the even field, operates at the leading edge of the pulse to issue an operation command to the counter circuit 110.

The counter circuit produces a pulse of the duration slightly longer than one horizontal scanning time but shorter than two horizontal scanning times. The counter circuit resets the flip-flop 106 when it completes pulse counting, and thus the flip-flop 106 produces output waveform $F_1$.

When a plurality of pulses are present within the shift register, an output pulse shown in FIG. 8K appears at the final stage of the shift register. The output pulse K, pulse $F_1$ and clock are ANDed in the AND gate circuit 109 to produce a pulse G. The two flip-flop circuits 107 and 108, when supplied with two or more pulses, produce abnormal pulses $F_2$ and $F_3$, respectively.

This pulse $F_3$ is supplied to the gate circuit 44 thereby stopping the pulse from being transferred.

When the shift register comes to include no pulse, the start pulse generator circuit starts to operate, supplying normal pulse $F_4$ to the input end of the shift register and also the flip-flops 107 and 108 are reset to open the gate circuit 44, enabling pulse transfer.

The circuits 46 and 47 constitute a malfunction preventing circuit for the case where the ring counter is filled with transferred pulses. The NAND circuit 46 detects the pulse filled condition and the gate circuit 47 prevents pulse transfer, thereby bringing about the normal condition.

The present invention has been described in detail. The pulse generator circuit according to this invention is able to supply necessary pulses to the solid-state television camera without adverse effect on the S/N ratio of television signal to noise and also generate interlace scanning pulse even if there is no pulse of the frequency which is twice the horizontal scanning frequency.

While in the above description the pulse generator circuit is for the MOS-type solid-state image sensor, the pulse generator circuit according to this invention can be used for the charge-transfer type CCD solid-state image sensor for transferring picture signal in the vertical scanning period (for example, about 60 Hz for NTSC system, and 50 Hz for PAL system) and in the horizontal scanning period (about 15.75 kHz for NTSC system and 15.625 kHz for PAL system), and image sensors of CID (charge injection device) and CPD (charge priming device).

We claim:

1. A pulse generator circuit for a solid-state television camera comprising:

first means for producing pulses of a horizontal scanning frequency, said first means including an oscillator for generating clock pulses, a shift register driven by said clock pulses, said shift register having a number of stages sufficient for dividing a frequency of the clock pulses into the horizontal scanning frequency, said shift register having an output terminal thereof connected with an input terminal thereof so as to form a ring counter circuit, and a pulse generator for generating a pulse to be applied to said input terminal of said shift register for transfer through said shift register;

second means for producing pulse trains of the horizontal scanning frequency for the television camera, said pulse trains being produced in response to a plurality of pulses extracted from the stages of said shift register having frequencies which are the same as the horizontal scanning frequency and phases which are different from each other;

third means for producing pulses for interlace scanning, said third means including a divider circuit for dividing the pulse train of the horizontal scanning frequency obtained from said second means so that said pulse train is alternately divided by two different factors n and n+1 (n being a positive integer), and delay means for delaying said pulse divided by n for one half of the horizontal scanning time period.

2. A pulse generator circuit according to claim 1, wherein said first means further includes a circuit for stopping said shift register from transferring a pulse when a plurality of pulses (including a single pulse continuous over several stages) are present within said shift register.

3. A pulse generator circuit according to claim 1, wherein said pulse generator starts oscillation when the transferred pulse in said shift register is erased so as to generate a pulse to be transferred in said shift register.

4. A pulse generator circuit according to claim 1, wherein said delay means further includes a shift register for shifting the pulse divided by n, and a delay circuit delaying the clock pulse driving said shift register for one half of the horizontal scanning time period.

5. A pulse generator circuit according to claim 2, wherein said pulse generator starts oscillation when the transferred pulse in said shift register is erased so as to generate a pulse to be transferred in said shift register.

* * * * *